(12) United States Patent
Katz et al.

(10) Patent No.: US 10,095,659 B2
(45) Date of Patent: Oct. 9, 2018

(54) HANDHELD DEVICES, SYSTEMS, AND METHODS FOR MEASURING PARAMETERS

(71) Applicant: Fluke Corporation, Everett, WA (US)

(72) Inventors: Luis Alberto Katz, Everett, WA (US); Henricus Koppelmans, Uden (NL); Paul Herman Heydron, Everett, WA (US); David Lawrence Epperson, Everett, WA (US)

(73) Assignee: Fluke Corporation, Everett, WA (US)

( * ) Notice: Subject to any disclaimer, the term of this patent is extended or adjusted under 35 U.S.C. 154(b) by 693 days.

(21) Appl. No.: 13/830,772

(22) Filed: Mar. 14, 2013

(65) Prior Publication Data

US 2014/0039838 A1 Feb. 6, 2014

Related U.S. Application Data

(60) Provisional application No. 61/707,796, filed on Sep. 28, 2012, provisional application No. 61/679,659, filed on Aug. 3, 2012.

(51) Int. Cl.
*G06F 17/00* (2006.01)
*G01R 15/12* (2006.01)
(Continued)

(52) U.S. Cl.
CPC .............. *G06F 17/00* (2013.01); *G01R 1/04* (2013.01); *G01R 1/06788* (2013.01);
(Continued)

(58) Field of Classification Search
CPC .... G01R 1/04; G01R 1/06788; G01R 15/125; H04Q 9/00; H04Q 2209/40; H04Q 2209/84
See application file for complete search history.

(56) References Cited

U.S. PATENT DOCUMENTS 4,644,320 A 2/1987 Carr et al.
4,717,872 A 1/1988 Wagner et al.
(Continued)

FOREIGN PATENT DOCUMENTS

CA 2152024 A1 12/1995
CN 1237302 A 12/1999
(Continued)

OTHER PUBLICATIONS

Extended European Search Report dated Sep. 10, 2013, issued in corresponding Application No. Ep 13 178 211.2, filed Jul. 26, 2013, 8 pages.
(Continued)

*Primary Examiner* — Hai Phan
*Assistant Examiner* — Son M Tang
(74) *Attorney, Agent, or Firm* — Seed Intellectual Property Law Group LLP

(57) ABSTRACT

Embodiments of the present disclosure are generally directed to handheld systems, individual components, and methods of using such systems and components for measuring parameters, such as electrical, mechanical, and physical measurement parameters. In one embodiment of the present disclosure, a gateway device for a measurement system generally includes a first communication system for receiving at least one signal containing data according to a first protocol, wherein the at least one signal includes at least one measurement value from at least one handheld measurement device, a signal translator for translating the signal containing the data to another signal containing the data according to a second protocol different from the first protocol, and a data memory system for storing data on the gateway device.

13 Claims, 11 Drawing Sheets

(51) Int. Cl.
*H04L 29/08* (2006.01)
*H04L 29/06* (2006.01)
*G01R 31/302* (2006.01)
*G01R 1/04* (2006.01)
*G01R 1/067* (2006.01)
*G01D 21/00* (2006.01)

(52) U.S. Cl.
CPC ....... *G01R 15/125* (2013.01); *G01R 31/3025* (2013.01); *H04L 67/125* (2013.01); *H04L 67/2823* (2013.01); *H04L 69/26* (2013.01); *G01D 21/00* (2013.01)

(56) References Cited

U.S. PATENT DOCUMENTS

| | | |
|---|---|---|
| 4,754,218 A | 6/1988 | Wagner et al. |
| 5,172,052 A | 12/1992 | Wells |
| 5,386,117 A | 1/1995 | Piety et al. |
| 5,428,342 A | 6/1995 | Enoki et al. |
| 5,594,332 A | 1/1997 | Harman et al. |
| 5,637,871 A | 6/1997 | Piety et al. |
| 5,650,771 A | 7/1997 | Lee |
| 5,664,207 A | 9/1997 | Crumpler et al. |
| 5,748,104 A * | 5/1998 | Argyroudis ............ G08C 17/02 340/870.02 |
| 5,767,667 A | 6/1998 | Shafie |
| 5,992,237 A * | 11/1999 | McCarty ................ G01H 1/003 702/56 |
| 6,202,491 B1 * | 3/2001 | McCarty ................ G01D 9/005 702/56 |
| 6,219,340 B1 | 4/2001 | Cutler et al. |
| 6,229,526 B1 | 5/2001 | Berstis |
| 6,243,105 B1 | 6/2001 | Hoyer et al. |
| 6,261,230 B1 | 7/2001 | Bardy |
| 6,280,380 B1 | 8/2001 | Bardy |
| 6,298,308 B1 * | 10/2001 | Reid ...................... G01H 1/003 702/188 |
| 6,336,900 B1 * | 1/2002 | Alleckson ........... G06F 19/3412 128/904 |
| 6,363,057 B1 * | 3/2002 | Ardalan ............... H02J 13/0062 340/870.02 |
| 6,363,488 B1 | 3/2002 | Ginter et al. |
| 6,437,692 B1 * | 8/2002 | Petite ..................... G01D 4/004 340/3.1 |
| 6,441,723 B1 | 8/2002 | Mansfield, Jr. et al. |
| 6,489,884 B1 * | 12/2002 | Lamberson ............ G01H 1/003 340/3.1 |
| 6,496,705 B1 | 12/2002 | Ng et al. |
| 6,501,983 B1 | 12/2002 | Natarajan et al. |
| 6,571,140 B1 * | 5/2003 | Wewalaarachchi .. G05B 19/418 700/17 |
| 6,684,245 B1 * | 1/2004 | Shuey ..................... G01D 4/004 707/999.1 |
| 6,891,478 B2 | 5/2005 | Gardner |
| 6,934,862 B2 | 8/2005 | Sharood et al. |
| 6,985,819 B2 | 1/2006 | Lipscomb et al. |
| 6,993,417 B2 | 1/2006 | Osann, Jr. |
| 7,076,239 B2 | 7/2006 | Kirkup et al. |
| 7,149,285 B2 | 12/2006 | Kennedy et al. |
| 7,191,184 B2 | 3/2007 | Laborde et al. |
| 7,236,900 B2 | 6/2007 | Hagen et al. |
| 7,289,887 B2 | 10/2007 | Rodgers |
| 7,304,618 B2 | 12/2007 | Plathe |
| 7,310,583 B2 | 12/2007 | De La Quintana |
| 7,312,603 B2 * | 12/2007 | Luo .................... G01R 1/06788 324/117 R |
| 7,317,404 B2 | 1/2008 | Cumeralto et al. |
| 7,327,228 B2 | 2/2008 | Min et al. |
| 7,382,247 B2 * | 6/2008 | Welch ................... A61B 5/0024 340/539.1 |
| 7,385,524 B1 | 6/2008 | Orlosky |
| 7,423,985 B1 | 9/2008 | Hill |
| 7,424,527 B2 | 9/2008 | Petite |
| 7,454,050 B2 | 11/2008 | Garvey |
| 7,478,305 B2 | 1/2009 | Betawar et al. |
| 7,480,501 B2 | 1/2009 | Petite |
| 7,528,372 B2 | 5/2009 | Garvey, III et al. |
| 7,535,378 B2 | 5/2009 | Cornwall |
| 7,541,941 B2 | 6/2009 | Bogolea et al. |
| 7,561,200 B2 | 7/2009 | Garvey, III et al. |
| 7,561,867 B2 | 7/2009 | Frye, Jr. |
| 7,616,110 B2 * | 11/2009 | Crump ................ A61B 5/02055 128/903 |
| 7,703,032 B2 | 4/2010 | Wells |
| 7,706,596 B2 | 4/2010 | Garvey |
| 7,728,275 B2 | 6/2010 | Blanchard |
| 7,746,092 B2 | 6/2010 | Li |
| 7,791,351 B2 | 9/2010 | Raber |
| 7,902,507 B1 | 3/2011 | Garvey, III et al. |
| 7,917,382 B2 | 3/2011 | Cereghini et al. |
| 7,960,965 B2 | 6/2011 | Lund |
| 7,995,830 B2 | 8/2011 | Garvey |
| 8,003,942 B2 | 8/2011 | Garvey, III et al. |
| 8,005,576 B2 | 8/2011 | Rodgers |
| 8,024,724 B2 | 9/2011 | Garrison Stuber et al. |
| 8,036,597 B2 | 10/2011 | Rahman et al. |
| 8,085,143 B2 | 12/2011 | Hollander et al. |
| 8,090,480 B2 | 1/2012 | Brumfield et al. |
| 8,094,034 B2 | 1/2012 | Patel et al. |
| 8,119,986 B1 | 2/2012 | Garvey, III et al. |
| 8,124,923 B2 | 2/2012 | Blanchard |
| 8,131,489 B2 | 3/2012 | Heuser et al. |
| 8,148,687 B1 * | 4/2012 | Praly .................... G01N 25/72 250/330 |
| 8,170,722 B1 | 5/2012 | Elberbaum |
| 8,233,486 B2 * | 7/2012 | Phuah .................... H04L 12/66 370/395.2 |
| 8,269,650 B2 | 9/2012 | Cornwall et al. |
| 8,300,922 B1 | 10/2012 | Garvey, III |
| 8,319,658 B2 | 11/2012 | Conant et al. |
| 8,334,513 B1 | 12/2012 | Garvey, III et al. |
| 8,339,093 B2 | 12/2012 | Lu et al. |
| 8,358,903 B1 | 1/2013 | Meads et al. |
| 8,368,001 B2 | 2/2013 | Blanchard |
| 8,410,931 B2 * | 4/2013 | Petite .................. G08B 25/009 340/521 |
| 8,427,006 B2 | 4/2013 | Gilbert |
| 8,432,154 B2 | 4/2013 | Lund |
| 8,447,541 B2 | 5/2013 | Rada et al. |
| 8,450,995 B2 | 5/2013 | Wagner |
| 8,456,278 B1 * | 6/2013 | Bergman ................ H04L 69/18 340/5.8 |
| 8,489,063 B2 | 7/2013 | Petite |
| 8,502,821 B2 | 8/2013 | Louise et al. |
| 8,576,231 B2 | 11/2013 | Woodings et al. |
| 8,581,743 B2 | 11/2013 | Chan et al. |
| 8,618,930 B2 * | 12/2013 | Papadopoulos .... A61B 5/02427 340/539.11 |
| 8,639,465 B1 | 1/2014 | Elberbaum |
| 8,643,539 B2 | 2/2014 | Pauly et al. |
| 8,707,193 B2 * | 4/2014 | Khazanov .......... G05B 23/0264 715/764 |
| 8,712,732 B2 | 4/2014 | Patel et al. |
| 8,754,779 B2 | 6/2014 | Ruther |
| 8,836,318 B2 | 9/2014 | Cheng et al. |
| 8,870,086 B2 * | 10/2014 | Tessier .................. F24F 11/006 236/51 |
| 8,884,553 B2 * | 11/2014 | Hai .................... H05B 33/0866 315/312 |
| 8,976,039 B2 | 3/2015 | O'Hara et al. |
| 8,983,785 B2 | 3/2015 | Panko |
| 9,076,275 B2 | 7/2015 | Chinnadurai et al. |
| 9,117,251 B2 | 8/2015 | Schmidt et al. |
| 9,151,818 B2 | 10/2015 | Danesh et al. |
| 9,172,275 B2 | 10/2015 | Bhakta |
| 9,197,949 B2 | 11/2015 | Indovina et al. |
| 9,250,275 B2 | 2/2016 | Patel et al. |
| 9,319,288 B2 | 4/2016 | Somaiya et al. |
| 9,363,148 B2 | 6/2016 | Somaiya et al. |
| 9,384,116 B2 | 7/2016 | Rider et al. |
| 9,408,250 B2 | 8/2016 | Yi et al. |

(56) References Cited

U.S. PATENT DOCUMENTS

| | | |
|---|---|---|
| 9,430,353 B2 | 8/2016 | Shafi |
| 9,430,558 B2 | 8/2016 | Bhat et al. |
| 9,449,408 B2 | 9/2016 | Benson et al. |
| 9,454,820 B1 | 9/2016 | Kirmani et al. |
| 9,489,745 B1 | 11/2016 | Heitz, III et al. |
| 9,495,187 B2 | 11/2016 | Bingham et al. |
| 9,501,849 B2 | 11/2016 | Wong et al. |
| 9,733,974 B2 | 8/2017 | Bingham et al. |
| 9,766,270 B2 | 9/2017 | Heydron et al. |
| 9,900,560 B1 | 2/2018 | Kirmani et al. |
| 2001/0001850 A1 | 5/2001 | Miller |
| 2001/0025138 A1 | 9/2001 | Bardy |
| 2001/0038343 A1 | 11/2001 | Meyer et al. |
| 2001/0051764 A1 | 12/2001 | Bardy |
| 2002/0193144 A1 | 12/2002 | Belski et al. |
| 2003/0020759 A1 | 1/2003 | Cancilla et al. |
| 2003/0058243 A1 | 3/2003 | Faust et al. |
| 2003/0128212 A1 | 7/2003 | Pitkow |
| 2003/0158677 A1 | 8/2003 | Swarztrauber et al. |
| 2004/0028023 A1* | 2/2004 | Mandhyan ............ G01D 21/00 370/351 |
| 2004/0140908 A1 | 7/2004 | Gladwin et al. |
| 2004/0197040 A1* | 10/2004 | Walker .................. F16C 19/52 384/462 |
| 2004/0227501 A1 | 11/2004 | Wobben |
| 2004/0249605 A1 | 12/2004 | Komatsu |
| 2004/0253997 A1* | 12/2004 | Kochie ................ G07C 5/0808 455/575.1 |
| 2005/0060107 A1 | 3/2005 | Rodenberg, III et al. |
| 2005/0065743 A1* | 3/2005 | Cumming .............. G01D 4/004 702/62 |
| 2005/0125512 A1 | 6/2005 | Fuller, III et al. |
| 2005/0132241 A1 | 6/2005 | Curt et al. |
| 2005/0171411 A1 | 8/2005 | KenKnight et al. |
| 2005/0194962 A1 | 9/2005 | Briese et al. |
| 2005/0195757 A1* | 9/2005 | Kidder ................. H04W 60/00 370/278 |
| 2005/0212526 A1 | 9/2005 | Blades |
| 2005/0225347 A1 | 10/2005 | Khandros et al. |
| 2005/0270151 A1* | 12/2005 | Winick ............... F24F 11/0086 340/539.1 |
| 2005/0289264 A1 | 12/2005 | Illowsky et al. |
| 2006/0062190 A1 | 3/2006 | Suga |
| 2006/0071812 A1* | 4/2006 | Mason, Jr. ............. G01D 4/004 340/870.02 |
| 2006/0097713 A1 | 5/2006 | Brandt |
| 2006/0101311 A1 | 5/2006 | Lipscomb et al. |
| 2006/0136825 A1 | 6/2006 | Cory et al. |
| 2006/0145890 A1 | 7/2006 | Junker et al. |
| 2006/0167638 A1* | 7/2006 | Murphy ................ G08C 17/00 702/56 |
| 2006/0189871 A1 | 8/2006 | Al-Ali et al. |
| 2006/0202816 A1 | 9/2006 | Crump et al. |
| 2007/0007968 A1 | 1/2007 | Mauney, Jr. et al. |
| 2007/0057814 A1 | 3/2007 | Goldberg et al. |
| 2007/0083307 A1 | 4/2007 | Pasztor et al. |
| 2007/0100520 A1 | 5/2007 | Shah et al. |
| 2007/0100666 A1 | 5/2007 | Stivoric et al. |
| 2007/0118310 A1 | 5/2007 | Kindseth et al. |
| 2007/0118323 A1 | 5/2007 | Ishizuka |
| 2007/0126731 A1 | 6/2007 | Sabram |
| 2007/0156313 A1 | 7/2007 | Fudali et al. |
| 2007/0179754 A1* | 8/2007 | Sper ...................... H04Q 9/00 702/189 |
| 2007/0198222 A1 | 8/2007 | Schuster et al. |
| 2007/0297112 A1 | 12/2007 | Gilbert |
| 2008/0012701 A1 | 1/2008 | Kass et al. |
| 2008/0036466 A1 | 2/2008 | Raber |
| 2008/0042641 A1 | 2/2008 | Stockman |
| 2008/0046387 A1 | 2/2008 | Gopal et al. |
| 2008/0077336 A1 | 3/2008 | Fernandes |
| 2008/0082278 A1 | 4/2008 | Tan et al. |
| 2008/0091345 A1 | 4/2008 | Patel et al. |
| 2008/0161957 A1 | 7/2008 | Rice |
| 2008/0224892 A1 | 9/2008 | Bogolea et al. |
| 2008/0231719 A1 | 9/2008 | Benson et al. |
| 2009/0031042 A1* | 1/2009 | Phatak ............ H04L 29/12066 709/245 |
| 2009/0072985 A1 | 3/2009 | Patel et al. |
| 2009/0128124 A1 | 5/2009 | Garland et al. |
| 2009/0128127 A1 | 5/2009 | Garland et al. |
| 2009/0128128 A1 | 5/2009 | Garland et al. |
| 2009/0135836 A1 | 5/2009 | Veillette |
| 2009/0141593 A1 | 6/2009 | Taha |
| 2009/0150509 A1 | 6/2009 | Chang et al. |
| 2009/0210814 A1 | 8/2009 | Agrusa et al. |
| 2009/0237404 A1 | 9/2009 | Cannon, III |
| 2009/0262138 A1 | 10/2009 | Bradbury et al. |
| 2009/0275805 A1 | 11/2009 | Lane et al. |
| 2009/0292486 A1 | 11/2009 | Van Gorp et al. |
| 2009/0299940 A1 | 12/2009 | Hayes et al. |
| 2009/0315725 A1 | 12/2009 | Hollander et al. |
| 2009/0326410 A1 | 12/2009 | James et al. |
| 2010/0005331 A1 | 1/2010 | Somasundaram et al. |
| 2010/0014746 A1 | 1/2010 | Warnke et al. |
| 2010/0030289 A1 | 2/2010 | Casavant et al. |
| 2010/0058222 A1 | 3/2010 | Bergstrom et al. |
| 2010/0063785 A1 | 3/2010 | Pich et al. |
| 2010/0102926 A1* | 4/2010 | Grieve .................... H04Q 9/00 340/5.1 |
| 2010/0109842 A1 | 5/2010 | Patel et al. |
| 2010/0167659 A1 | 7/2010 | Wagner |
| 2010/0174419 A1 | 7/2010 | Brumfield et al. |
| 2010/0214299 A1 | 8/2010 | Robertson et al. |
| 2010/0217099 A1 | 8/2010 | LeBoeuf et al. |
| 2010/0217418 A1 | 8/2010 | Fontanot |
| 2010/0218305 A1 | 9/2010 | Weston et al. |
| 2010/0244868 A1 | 9/2010 | Cantave |
| 2010/0305889 A1 | 12/2010 | Tomlinson, Jr. et al. |
| 2010/0331651 A1 | 12/2010 | Groll |
| 2011/0012587 A1 | 1/2011 | Greenberg |
| 2011/0039571 A1 | 2/2011 | Bodine et al. |
| 2011/0085461 A1 | 4/2011 | Liu et al. |
| 2011/0087461 A1 | 4/2011 | Hollander et al. |
| 2011/0099424 A1 | 4/2011 | Rivera Trevino et al. |
| 2011/0101956 A1 | 5/2011 | Thorn |
| 2011/0106589 A1 | 5/2011 | Blomberg et al. |
| 2011/0115640 A1* | 5/2011 | Jiang ...................... H04Q 9/00 340/870.01 |
| 2011/0137678 A1 | 6/2011 | Williams |
| 2011/0153236 A1 | 6/2011 | Montreuil et al. |
| 2011/0184267 A1 | 7/2011 | Duke et al. |
| 2011/0199916 A1 | 8/2011 | Garrett et al. |
| 2011/0200045 A1* | 8/2011 | Baehre ............... H04L 12/4633 370/392 |
| 2011/0212700 A1 | 9/2011 | Petite |
| 2011/0248857 A1 | 10/2011 | Rutherford et al. |
| 2011/0285546 A1 | 11/2011 | Vadali |
| 2011/0288810 A1 | 11/2011 | Ishikawa et al. |
| 2011/0288900 A1 | 11/2011 | McQueen et al. |
| 2011/0298301 A1 | 12/2011 | Wong et al. |
| 2011/0307418 A1 | 12/2011 | Bouzaglo |
| 2011/0309820 A1 | 12/2011 | Khanke et al. |
| 2012/0001768 A1* | 1/2012 | Radosavljevic ........ H04Q 9/00 340/870.03 |
| 2012/0004886 A1 | 1/2012 | Jordil et al. |
| 2012/0007588 A1 | 1/2012 | Tan |
| 2012/0026005 A1 | 2/2012 | Myoung et al. |
| 2012/0029718 A1 | 2/2012 | Davis |
| 2012/0045988 A1 | 2/2012 | Blanton et al. |
| 2012/0046897 A1 | 2/2012 | Panko |
| 2012/0047424 A1 | 2/2012 | Rothschild |
| 2012/0083682 A1 | 4/2012 | Klodell et al. |
| 2012/0119791 A1 | 5/2012 | Hsiao |
| 2012/0130223 A1 | 5/2012 | Reicher |
| 2012/0138388 A1 | 6/2012 | Finschi et al. |
| 2012/0139952 A1 | 6/2012 | Imai et al. |
| 2012/0143387 A1 | 6/2012 | Indovina et al. |
| 2012/0146788 A1 | 6/2012 | Wilson et al. |
| 2012/0154172 A1 | 6/2012 | O'Hara et al. |
| 2012/0154404 A1 | 6/2012 | Clement et al. |
| 2012/0157009 A1 | 6/2012 | Hollander et al. |
| 2012/0172023 A1 | 7/2012 | Griff et al. |

(56) References Cited

U.S. PATENT DOCUMENTS

| | | |
|---|---|---|
| 2012/0178438 A1 | 7/2012 | Vashi et al. |
| 2012/0187883 A1 | 7/2012 | Valdez et al. |
| 2012/0224067 A1 | 9/2012 | Stuart et al. |
| 2012/0229270 A1 | 9/2012 | Morley et al. |
| 2012/0245878 A1 | 9/2012 | Kane et al. |
| 2012/0265586 A1 | 10/2012 | Mammone |
| 2012/0270505 A1 | 10/2012 | Prakash et al. |
| 2012/0271557 A1 | 10/2012 | Sekimoto et al. |
| 2012/0275651 A1 | 11/2012 | Brown |
| 2012/0278014 A1 | 11/2012 | Davies |
| 2012/0300089 A1 | 11/2012 | Sbaiz et al. |
| 2012/0310558 A1 | 12/2012 | Taft |
| 2012/0320189 A1 | 12/2012 | Stuart et al. |
| 2013/0009788 A1 | 1/2013 | Langenberg et al. |
| 2013/0024149 A1 | 1/2013 | Nayar et al. |
| 2013/0029683 A1* | 1/2013 | Kim .............. G01N 33/18 |
| | | 455/456.1 |
| 2013/0050246 A1 | 2/2013 | Barry et al. |
| 2013/0051498 A1 | 2/2013 | Taft |
| 2013/0065633 A1 | 3/2013 | Sridhara et al. |
| 2013/0066576 A1 | 3/2013 | Cs et al. |
| 2013/0106906 A1 | 5/2013 | Roche et al. |
| 2013/0124136 A1 | 5/2013 | Neeley et al. |
| 2013/0127904 A1* | 5/2013 | Dove .............. G06F 3/0488 |
| | | 345/629 |
| 2013/0137940 A1 | 5/2013 | Schafer |
| 2013/0147464 A1 | 6/2013 | Tan |
| 2013/0150744 A1* | 6/2013 | Brattain .......... A61B 5/4848 |
| | | 600/529 |
| 2013/0197835 A1 | 8/2013 | Jonsson et al. |
| 2013/0204554 A1 | 8/2013 | Tuckey et al. |
| 2013/0211214 A1 | 8/2013 | Olsen |
| 2013/0211731 A1 | 8/2013 | Woltman |
| 2013/0215154 A1 | 8/2013 | Ponomarev et al. |
| 2013/0215903 A1* | 8/2013 | Kotlicki .......... H04L 49/15 |
| | | 370/401 |
| 2013/0241746 A1 | 9/2013 | McKinley et al. |
| 2013/0245965 A1 | 9/2013 | Kane et al. |
| 2013/0249917 A1 | 9/2013 | Fanning et al. |
| 2013/0261821 A1 | 10/2013 | Lu et al. |
| 2013/0271467 A1 | 10/2013 | Misumi |
| 2013/0291060 A1 | 10/2013 | Moore |
| 2013/0300747 A1 | 11/2013 | Wong et al. |
| 2013/0307992 A1 | 11/2013 | Erlandsson et al. |
| 2013/0338958 A1 | 12/2013 | Shanishchara et al. |
| 2013/0344888 A1 | 12/2013 | Dousse |
| 2014/0018111 A1 | 1/2014 | Farley et al. |
| 2014/0035607 A1 | 2/2014 | Heydron et al. |
| 2014/0051941 A1 | 2/2014 | Messerschmidt |
| 2014/0152667 A1 | 6/2014 | Li et al. |
| 2014/0184604 A1 | 7/2014 | Bak et al. |
| 2014/0191573 A1 | 7/2014 | Chen et al. |
| 2014/0218383 A1 | 8/2014 | Srivastava |
| 2014/0232549 A1* | 8/2014 | Shin .............. H04Q 9/00 |
| | | 340/870.02 |
| 2014/0267294 A1 | 9/2014 | Ma et al. |
| 2014/0267296 A1 | 9/2014 | Neeley et al. |
| 2014/0274114 A1 | 9/2014 | Rowitch |
| 2014/0277827 A1 | 9/2014 | Chinnadurai et al. |
| 2014/0278255 A1 | 9/2014 | Anderson |
| 2014/0278259 A1 | 9/2014 | Neeley et al. |
| 2014/0279443 A1* | 9/2014 | Neeley ............. G01D 7/08 |
| | | 705/39 |
| 2014/0282145 A1 | 9/2014 | Dewan |
| 2014/0282241 A1 | 9/2014 | Epperson et al. |
| 2014/0300486 A1 | 10/2014 | Hummel et al. |
| 2014/0375428 A1* | 12/2014 | Park .............. G06K 7/10237 |
| | | 340/10.1 |
| 2014/0376377 A1 | 12/2014 | Mikoda et al. |
| 2015/0012147 A1 | 1/2015 | Haghighat-Kashani et al. |
| 2015/0022181 A1* | 1/2015 | Anderson .......... H04Q 9/00 |
| | | 324/114 |
| 2015/0035834 A1 | 2/2015 | Axness et al. |
| 2015/0039269 A1 | 2/2015 | Mejegård et al. |
| 2015/0133167 A1 | 5/2015 | Edge |
| 2015/0149119 A1 | 5/2015 | Fansler |
| 2015/0160284 A1 | 6/2015 | Cern |
| 2015/0185251 A1 | 7/2015 | Heydron et al. |
| 2015/0228097 A1 | 8/2015 | Matange et al. |
| 2015/0276816 A1 | 10/2015 | Yoshida et al. |
| 2015/0276830 A1 | 10/2015 | Airaksinen et al. |
| 2016/0028475 A1 | 1/2016 | Zhang et al. |
| 2016/0078127 A1 | 3/2016 | Bhat et al. |
| 2016/0117070 A1 | 4/2016 | Rose et al. |
| 2016/0140870 A1 | 5/2016 | Connor |
| 2016/0188185 A1 | 6/2016 | Bous |
| 2016/0212506 A1 | 7/2016 | Norwood et al. |
| 2016/0231372 A1 | 8/2016 | Wootton et al. |
| 2016/0232457 A1 | 8/2016 | Gray et al. |
| 2016/0321224 A1 | 11/2016 | Duncker et al. |
| 2016/0349954 A1 | 12/2016 | Thompson et al. |
| 2016/0370001 A1 | 12/2016 | Sim |
| 2017/0150069 A1 | 5/2017 | Parrish et al. |
| 2017/0154445 A1 | 6/2017 | Maruhashi |
| 2017/0177546 A1 | 6/2017 | Heinz et al. |

FOREIGN PATENT DOCUMENTS

| | | |
|---|---|---|
| CN | 1443404 A | 9/2003 |
| CN | 101061523 A | 10/2007 |
| CN | 101326479 A | 12/2008 |
| CN | 101498744 A | 8/2009 |
| CN | 101782600 A | 7/2010 |
| CN | 102188263 A | 9/2011 |
| CN | 102568170 A | 7/2012 |
| CN | 202351298 U | 7/2012 |
| EP | 1 560 121 A1 | 8/2005 |
| EP | 1 710 593 A1 | 10/2006 |
| EP | 2 026 080 A2 | 2/2009 |
| EP | 2 254 253 A2 | 11/2010 |
| EP | 2 889 630 A1 | 7/2015 |
| JP | 2003-110749 A | 4/2003 |
| JP | 2003-302260 A | 10/2003 |
| JP | 2004-69641 A | 3/2004 |
| JP | 2010-9477 A | 1/2010 |
| JP | 2010-272118 A | 12/2010 |
| JP | 2011-258109 A | 12/2011 |
| KR | 10 2008 0112692 A | 12/2008 |
| KR | 10 2012 0065540 A | 6/2012 |
| KR | 10 2012 0077332 A | 7/2012 |
| WO | 2013/020110 A2 | 2/2013 |

OTHER PUBLICATIONS

"IDVM: iOS Universal," Redfish Instruments, Aug. 14, 2013, <http://appshopper.com/utilities/idvm>, [retrieved Aug. 26, 2013], 2 pages.

"Redfish Instruments iDVM v1.0 User's Guide," Redfish Instruments, n. d., <http://www.redfishinstruments.com/sites/default/files/pdf/iDVM_1.0_Guide.pdf>, [retrieved Aug. 26, 2013], 21 pages.

Bicelli, S., et al., "From the Traditional Multimeter to the 'Wireless Multimeter Networking'," Proceedings of the IEEE Instrumentation and Measurement Technology Conference, Sorrento, Italy, Apr. 24-27, 2006, pp. 1581-1586.

European Search Report dated Nov. 11, 2013, in European Application No. 13178568.5, filed Jul. 30, 2013, 8 pages.

Extended European Search Report, dated Jun. 1, 2015, for European Application No. 14200521.4-1560, 9 pages.

Extech Instruments, "Extech EX540 Wireless Datalogging selected as 2010 EC&M Product of the Year Category Winner," Press Release, Mar. 18, 2009, 2 pages.

Extech Instruments, "Extech EX845 METERLiNK™ Clamp Meter Transmit Readings to FLIR IR Cameras," Press Release, Apr. 1, 2010, 3 pages.

Extech Instruments, "MultiMeter/Datalogger with Wireless PC Interface," Product Datasheet, Jul. 14, 2011, 1 page.

Extech Instruments, "Wireless TRMS Multimeter—Model EX540," User's Guide, Apr. 1, 2010, 17 pages.

(56) References Cited

OTHER PUBLICATIONS

Fluke, "1652C/1653B/1654B Electrical Installation Tester," Users Manual, Sep. 2010, 66 pages.
Fluke, "Basic electrical installation testing," Application Note, 2014, 4 pages.
Fluke, "Performing Live-Circuit Installation Tests with a Fluke 1650 series Tester on an IT-system," Application Note, 2004, 8 pages.
Fluke, "Testing RCDs with the Fluke 1650B Series," Application Note, 2014, 2 pages.
Fluke, "The importance of loop impedance testing," Application Note, 2003, 2 pages.
"Fluke 3000 FC Fluke Connect Series Wireless Digital Multimeter," retrieved from http://www.testequity.com/products/5220, retrieved on Sep. 1, 2015, 2 pages.
Hoh et al., "Wireless Remote Connectivity with Handheld Digital Multimeters," 2012, retrieved from, http://www.wirelessdesignmag.com/blog/2012/03/wireless-remote-connectivity-handheld-digital-multimeters, retrieved on Sep. 1, 2015, 6 pages.
International Search Report, dated Jul. 10, 2014, for International Application No. PCT/US2014/029561, 2 pages.
International Search Report and Written Opinion, dated Sep. 12, 2014, for International Application No. PCT/US2014/029867, 12 pages.
International Search Report and Written Opinion, dated Jul. 24, 2014, for International Application No. PCT/US2014/029879, 12 pages.
International Search Report and Written Opinion, dated Jul. 22, 2014, for International Application No. PCT/US2014/029883, 13 pages.
International Search Report and Written Opinion, dated Jul. 18, 2014, for International Application No. PCT/US2014/029885, 16 pages.
International Search Report and Written Opinion, dated Jul. 17, 2014, for International Application No. PCT/US2014/029889, 13 pages.
Supplementary European Search Report dated Oct. 20, 2016, for European Application No. 14762404.3, 7 pages.
Office Action, dated Oct. 31, 2016, for Chinese Application No. 201310334993.1, 30 pages. (with English Translation).
Office Action, dated Nov. 2, 2016, for Chinese Application No. 201480027748.9, 22 pages. (with English Translation).
Japanese Office Action, dated Jan. 23, 2018, for Japanese Application No. 2016-503271, 10 pages (with English translation).

\* cited by examiner

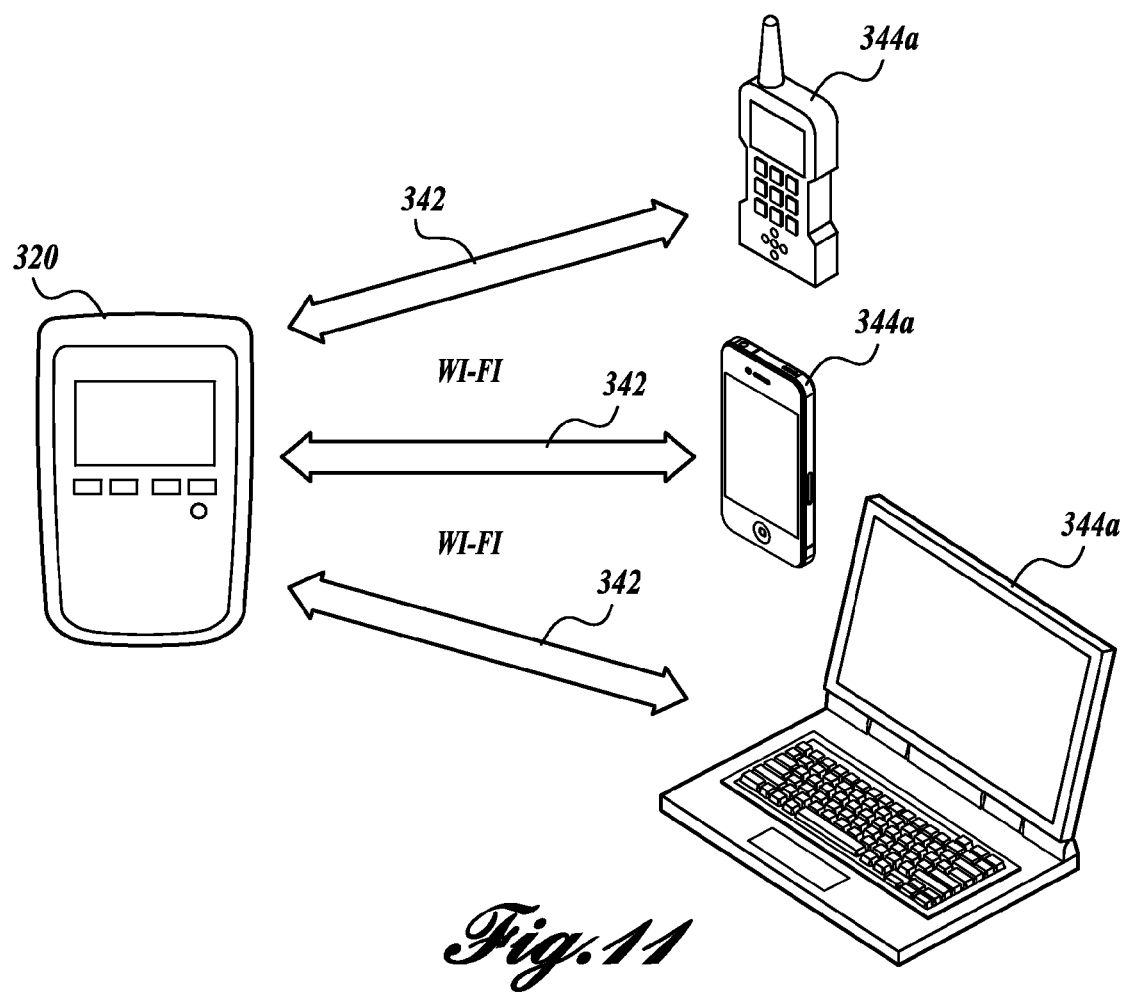

HANDHELD DEVICES, SYSTEMS, AND METHODS FOR MEASURING PARAMETERS

CROSS-REFERENCE TO RELATED APPLICATIONS

This application claims the benefit of U.S. Provisional Patent Application No. 61/707,796, filed Sep. 28, 2012, and U.S. Provisional Patent Application No. 61/679,659, filed Aug. 3, 2012, the disclosures of which are hereby incorporated by their reference herein in their entirety.

BACKGROUND

When troubleshooting problems with machines, technicians typically use handheld devices useful for basic fault finding and field service work. These devices can generally be used to troubleshoot electrical, mechanical, or other problems in a wide array of industrial and household devices, such as electronic equipment, motor controls, domestic appliances, power supplies, and wiring systems.

For proper diagnosis during troubleshooting, technicians frequently make multiple measurements at different places, and sometimes these measurements need to occur simultaneously or close in time proximity. The locations of the individual measurements may be in difficult-to-reach locations, for example, in the back of the machine or behind a panel that has an interlock in place. Moreover, if a technician is required to defeat the interlock to make a measurement, it may lead to a potentially hazardous situation for the technician or for others. Further, if the technician needs to connect measurement equipment in the back of the machine, he often either needs assistance from another person or must continually move from back to front to both operate the machine and read measurements.

Therefore, a system is needed that allows a technician to reduce the amount of time spent connecting and reconnecting instrumentation. Such a system would allow the technician to safely power down equipment and connect the proper instrumentation, then secure any opened panels or interlocks before making measurements. Moreover, a system is needed that allows simultaneous or near simultaneous multiple measurements for troubleshooting intermittent problems.

SUMMARY

The following summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with at least one embodiment of the present disclosure, a host handheld measurement device is provided. The device generally includes a measuring system for measuring a first parameter and determining a first measurement value. The first parameter may be, for example, an electrical parameter. The device further includes a receiving system for receiving at least a second measurement value from a separate measurement device.

In accordance with another embodiment of the present disclosure, a method of measuring parameters using a host handheld measurement device is provided. The method generally includes measuring a first parameter using the host device, and receiving from a separate measurement device a second measurement value determined by the separate measurement device.

In accordance with another embodiment of the present disclosure, a handheld module device is provided. The device generally includes a measuring system for measuring a first parameter and determining a first measurement value, and a communication system for communicating the first measurement value to a separate host measurement device, wherein a communication link between the host measurement device and the communication system is automatically established by activating only the host device.

In accordance with another embodiment of the present disclosure, a method of measuring parameters using a handheld module device is provided. The method generally includes activating a communication link between the module device and a separate host measurement device by activating a separate host measurement device. The method further includes measuring a first parameter using the handheld module device and determining a first measurement value, and communicating the first measurement value to the host device for display with a second measurement value determined by the host device.

In accordance with another embodiment of the present disclosure, a handheld system for measuring parameters is provided. The system generally includes a primary device capable of taking a first measurement. The first measurement may be an electrical, mechanical, or physical parameter. The system further includes a secondary device capable of taking a second measurement and transmitting the second measurement to the primary device.

In accordance with another embodiment of the present disclosure, a method of measuring parameters using a handheld system is provided. The method generally includes taking a first measurement using a primary handheld device, wherein the first measurement is an electrical, mechanical, or physical parameter, taking a second measurement using a secondary handheld device, transmitting the second measurement to the primary handheld device, and displaying both the first and second measurements on a display of the primary handheld device.

In accordance with another embodiment of the present disclosure, a method of measuring parameters using a handheld system is provided. The method generally includes binding a secondary device to a primary device by activating only the primary device to automatically establish a link between the primary and secondary devices, taking a first measurement using the primary device, taking a second measurement using the secondary device, and transmitting the second measurement to the primary device.

In accordance with another embodiment of the present disclosure, a gateway device for a measurement system is provided. The gateway device generally includes a first communication system configured to receive at least one signal containing data according to a first protocol, wherein the at least one signal includes at least one measurement value from at least one handheld measurement device, a data translator configured to translate the signal containing the data to a translated signal containing the data according to a second protocol different from the first protocol, and a data memory system configured to collect the data.

In accordance with another embodiment of the present disclosure, a method of collecting measurement data from a handheld measurement device is provided. The method generally includes in a first communication system of a gateway device receiving at least one signal containing data according to a first protocol, wherein the at least one signal includes at least one measurement value from at least one handheld measurement device, translating the signal containing the data to a translated signal containing the data according to a second protocol different from the first protocol, and storing the data in a data memory system on the gateway device.

DESCRIPTION OF THE DRAWINGS

The foregoing aspects and many of the attendant advantages of this disclosure will become more readily appreciated by reference to the following detailed description, when taken in conjunction with the accompanying drawings, wherein:

FIGS. 9-11 depict various embodiments of gateway systems in accordance with embodiments of the present disclosure.

DETAILED DESCRIPTION

Embodiments of the present disclosure are generally directed to handheld systems, individual components, and methods of using such systems and components for measuring parameters, such as electrical, mechanical, and physical measurement parameters. The embodiments described herein are useful for testing or monitoring a plurality of measurement parameters, which may be in multiple different locations, some even behind closed panels or interlocks.

Prior to discussing the details of various aspects of the present disclosure, it should be understood that one or more sections of the following description may be presented in terms of logic and operations that may be performed by conventional electronic components. These electronic components, which may be grouped in a single location or distributed over a wide area, generally include controllers, microcontrollers, control units, processors, microprocessors, etc. It will be appreciated by one skilled in the art that any logic described herein may be implemented in a variety of configurations, including, but not limited to, hardware, software, and combinations thereof. The hardware may include, but is not limited to, analog circuitry, digital circuitry, processing units, application-specific integrated circuits (ASICs), and the like, and combinations thereof. In circumstances in which the components of the system are distributed, the components are accessible to each other via communication links.

While some embodiments have been illustrated and described, it will be appreciated that various changes can be made therein without departing from the spirit and scope of the disclosure. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Additionally, it will be appreciated that embodiments of the present disclosure may employ any combination of the features described herein.

Figure 1:
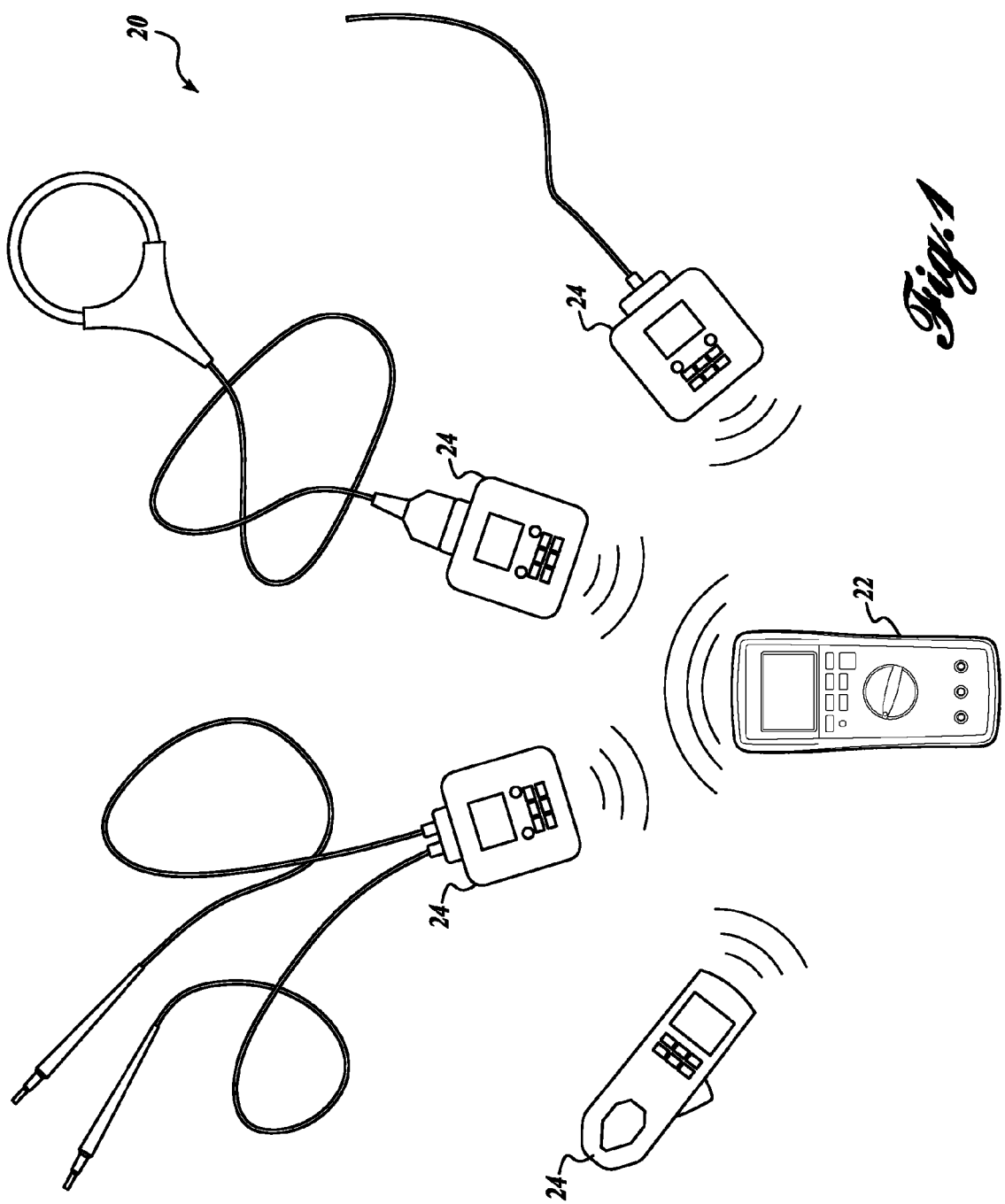
FIG. 1 is a schematic of a system in accordance with embodiments of the present disclosure.

As can be seen in FIGS. 1 and 2, an embodiment of the present disclosure is directed to a system 20 for taking and displaying measurement parameters. The system 20 includes a plurality of handheld or portable measurement devices. For example, the system 20 includes a primary device 22 and at least one secondary device 24. In an embodiment of the present disclosure, the primary device 22 is capable of taking a first measurement, and the secondary device 24 is capable of taking a second measurement and transmitting the second measurement to the primary device 22.

One advantage of the embodiments described herein is that a user can operate the systems of the present disclosure to make measurements in remote or hard-to-reach areas, such as behind machinery or interlocks. In that regard, at least one secondary device 24 may be positioned remotely from the primary device 22 to test or monitor at least a second parameter. Therefore, the primary device 22 can not only test or monitor a first parameter and display the resulting data for the user, but the primary device 22 can also receive data from the secondary device 24 and display that data on the primary device 22 for the user. Therefore, the system 20 described herein simplifies the work of the user by not requiring the user to go to the location of the secondary device 24 to read the data.

Although the system 20 is shown and described as including primary and secondary devices 22 and 24, it should be appreciated that there may be any number of devices in the system 20 for taking measurements and transmitting the measurements to the primary device 22. In at least one embodiment of the present disclosure, the system 20 may include up to ten discrete devices. In an embodiment of the present disclosure, the system 20 may include up to twenty discrete devices. In another embodiment of the present disclosure, the system 20 may include any number of discrete devices. As will be described in greater detail below, in a system 20 including more than two devices, the system 20 is configured in a one-to-many (or a "star") communication configuration with the primary device 22.

A handheld system or device as described herein includes one or more devices generally configured to be holdable in a user's hand while taking a measurement. However, it should be appreciated that the system or device need not be held in a user's hand and may be positioned by a user to not be held, for example, by affixing or hanging the system or device from a support or from a machine.

The handheld system 20 is generally configured to measure at least one parameter, such as an electrical, mechanical, or physical parameter. In that regard, one or more devices in the system 20 may be configured to measure at least one parameter including, but not limited to, voltage, current, vibration, resistance, capacitance, inductance, frequency, and any calculated value derived from a primary electrical, mechanical, or physical measurement. One or more devices in the system 20 may be configured to measure non-electrical or non-mechanical parameters, including, but not limited to, temperature, relative humidity, decibels, magnetic field, flow velocity, moisture, rotational speed, pressure, distance, light, contact infrared, as well as calculated values derived from a primary measurement, such as wattage, power quality, crest factor, and duty cycle.

Still referring to FIGS. 1 and 2, the primary device 22 may be a host device. In that regard, the primary device 22 may be configured to collect data received from various devices in the system 20, for example, from the secondary device 24 (or from a plurality of module devices). Moreover, the primary device 22 may be a test instrument for independently taking one or more measurements and collecting the data from such measurements. As described in greater detail below, the primary device 22 may further include a display 30 for displaying data, whether the data is collected from other devices in the system 20 or measured by the primary device 22.

Figure 3:
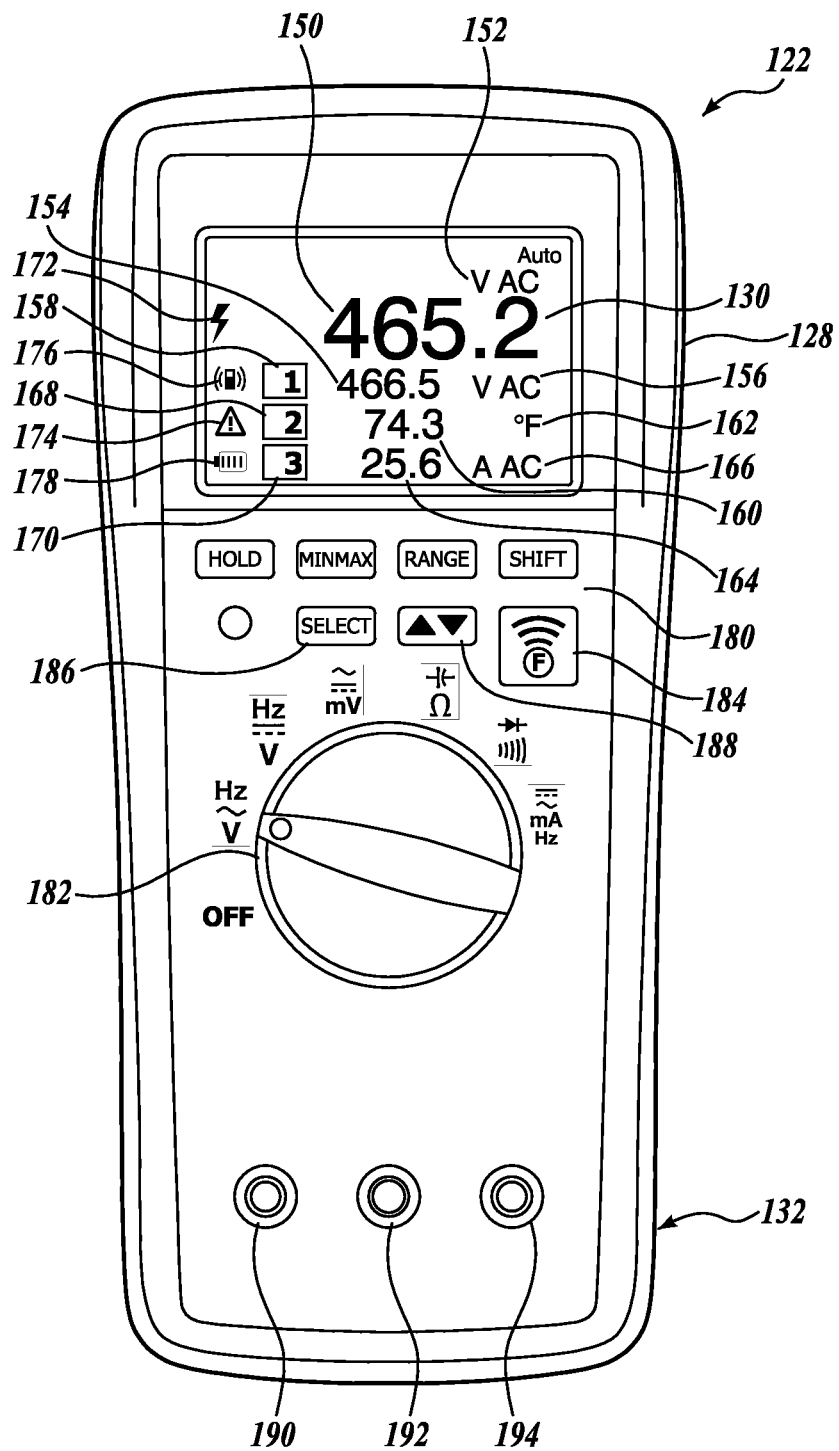
FIG. 3 is a front view of a primary device in accordance with an embodiment of the present disclosure.

In an embodiment of the present disclosure, the primary device 22 is a multimeter, such as a handheld digital multimeter, as can be seen in the illustrated embodiment of FIG. 3. In that regard, the primary device 22 may be an electronic measuring instrument that combines one or more measurement functions in one unit. As a non-limiting example, the primary device 22 may be capable of taking multiple measures, such as DC voltage, AC voltage, resistance, continuity, and current, as indicated by the plurality of rotary switch 182 positions in the exemplary embodiment of FIG. 3.

Figure 4:
FIGS. 4-7 are exemplary embodiments of systems in accordance with embodiments of the present disclosure.
Figure 5:
Figure 6:
Figure 7:

The secondary device 24 may be a module device that communicates with the primary device 22. In that regard, the secondary device 24 may be constructed the same or different from the primary device 22. In an embodiment of the present disclosure, secondary device 24 is a handheld digital multimeter. In other embodiments of the present disclosure, the secondary device 24 may be, for example, a temperature module (see FIG. 4), a clamp meter (see FIGS. 5 and 6), or a flexible current probe meter (see FIG. 7).

Referring to the schematic of FIG. 2A, the components of the primary device 22 will now be described in greater detail. The primary device 22 may include various components including an input/output (I/O) interface 28 (including, for example, a display 30 and an input interface 36 for user input), a measurement system 32 for taking measurements, a first communication system 34 for receiving and/or transmitting information, a central processing unit (CPU) or processor 38, and a storage system 40 for storing information. The primary device 22 may further include an optional second communication system 42.

Depending on the particular configuration and type of device, the storage system 40 may include system memory in the form of volatile or nonvolatile memory, such as read only memory ("ROM"), random access memory ("RAM"), EEPROM, flash memory, or other memory technology. Those of ordinary skill in the art and others will recognize that system memory typically stores data and/or program modules that are immediately accessible to and/or currently being operated on by the processor 38. In this regard, the processor 38 serves as a computational center of the primary device 22 by supporting the execution of program instructions.

The memory may also include storage memory. The storage memory may be any volatile or nonvolatile, removable or non-removable memory, implemented using any technology capable of storing information. Examples of storage memory include, but are not limited to, a hard drive, solid state drive, CD ROM, DVD, or other disk storage, magnetic cassettes, magnetic tape, magnetic disk storage, and the like. The information stored in the storage memory may include, but is not limited to, program modules and data to be accessed by the processor 38. Generally, program modules may include routines, applications, objects, components, data structures, etc., that perform particular tasks or implement particular abstract data types. It will be appreciated that system memory and storage memory described herein are merely examples of various computer-readable storage media.

The storage system 40 may also be configured to store information received from the measurement system 32 of the primary device 22 and from measurement systems in secondary devices 24 received through the communication system 34. When information is received in the storage system 40, the processor 38 may be configured to execute instructions to directly display the information received from the measurement system 32 or from the first communication system 34 on the display 30.

For user interaction with the primary device 22, the I/O interface 28 may include a variety of components that enable the processor 38 to obtain inputs from and provide outputs to a user and/or other components in the system 20. Although shown as including a keypad 36 and the display 30 in the illustrated embodiment, the I/O interface 28 may include, but is not limited to, a display, such as an LCD, an LPD, OLED display, etc., a keypad, hard or soft keyboards, a touchpad, controls, physical buttons, scroll wheels, a digital pen, trackballs, a joystick, etc. In at least one embodiment, the display 30, may be configured as an I/O interface, such as a touch screen, without requiring a separate keypad 36. The I/O interface 28 may also receive input from and in some embodiments may provide output to one or more secondary devices 24.

Figure 2A:
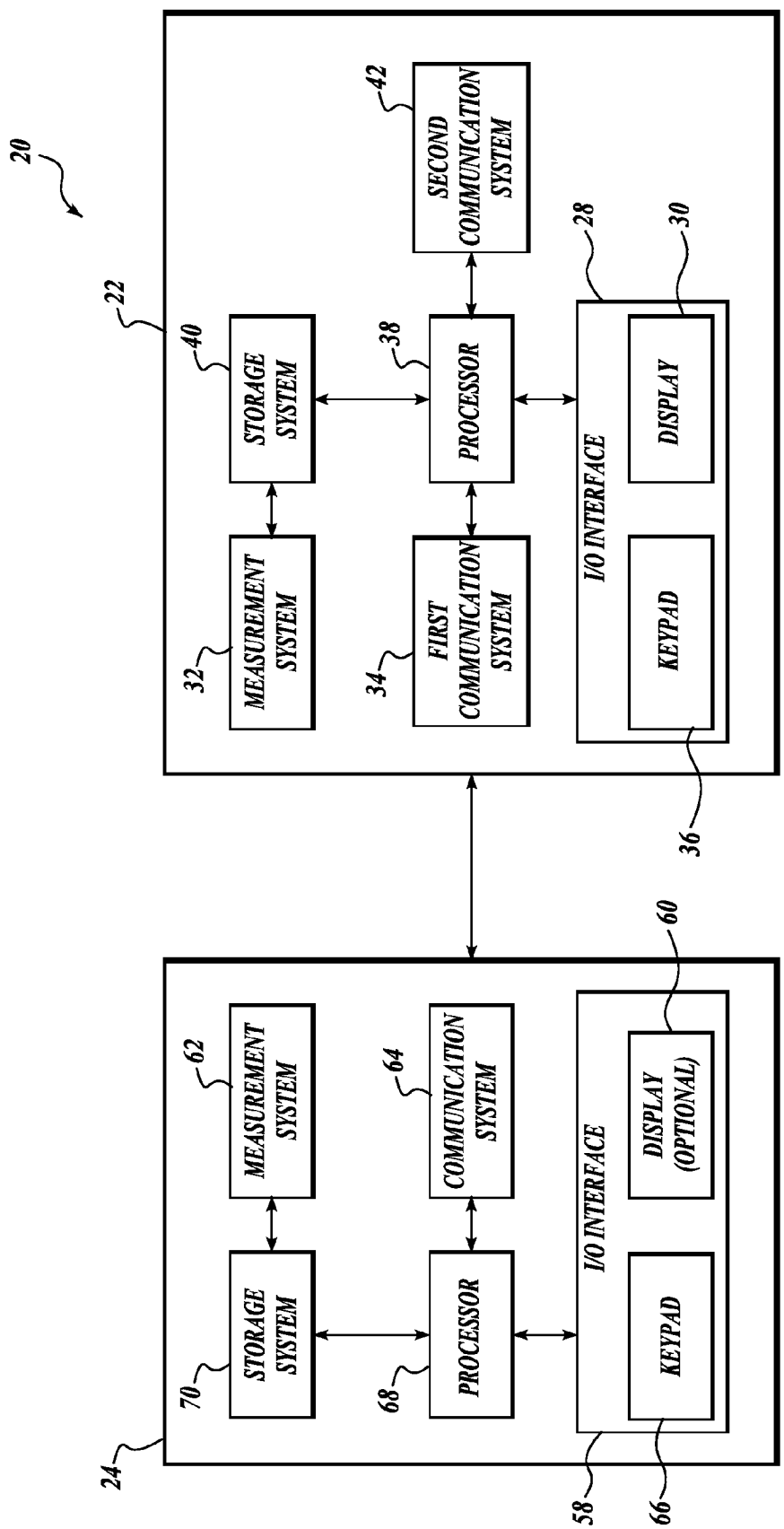
FIG. 2A is a schematic of operation for a primary device in the system shown in FIG. 1.
Figure 2B:
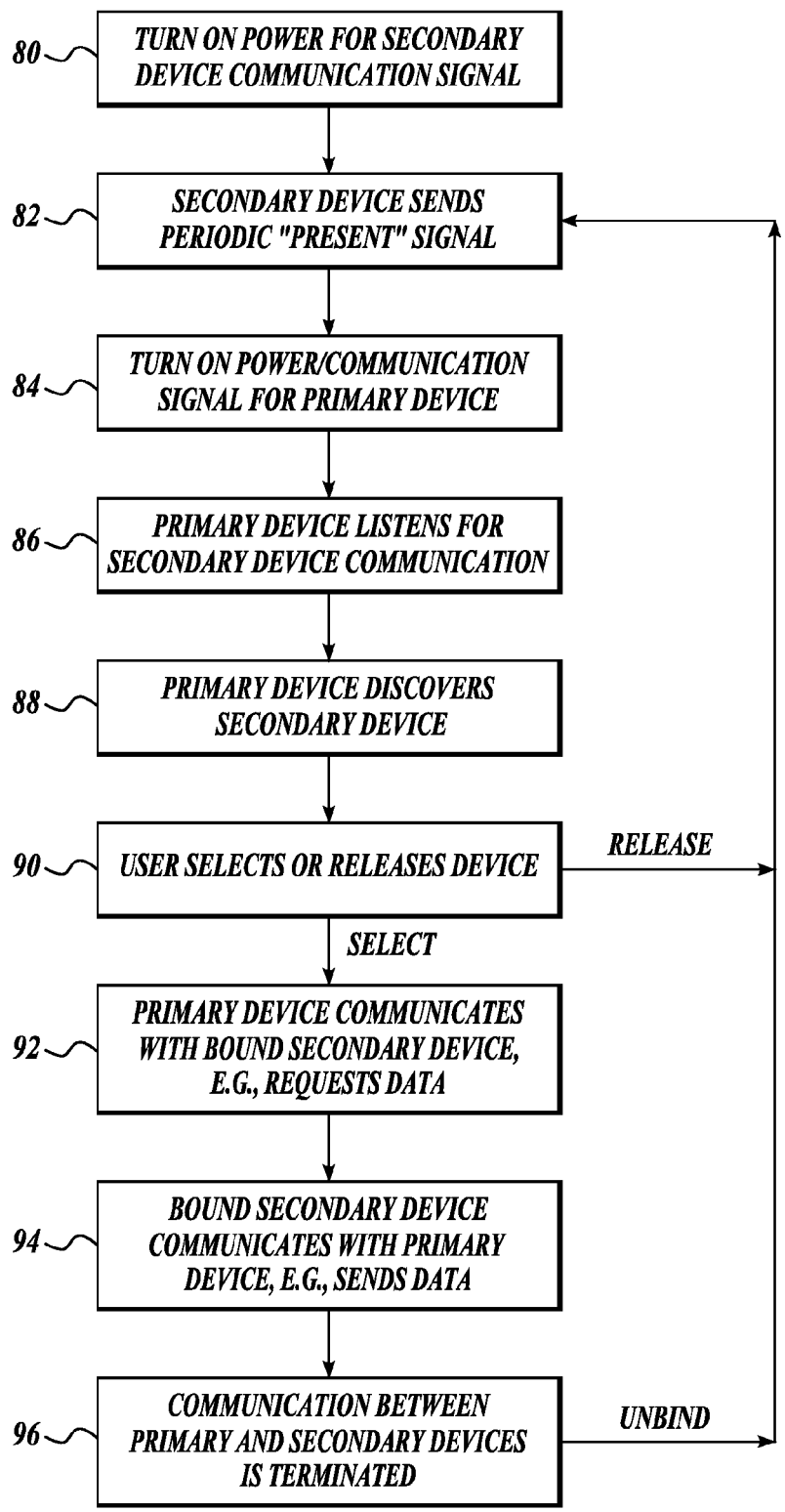
FIG. 2B is a flowchart diagram depicting a discovery and binding operation for the system shown in FIG. 2A in accordance with an embodiment of the present disclosure.

Still referring to FIG. 2A, the first communication system 34 includes one or more components for communicating with one or more discrete secondary devices 24 (as can be seen in FIG. 1) using a suitable wired or wireless communication protocol for transmitting and/or receiving information, including, but not limited to, USB, WiFi, or BLUETOOTH. In an embodiment of the present disclosure, the information is communicated in the system 20, for example, from the secondary device 24 to the primary device 22, by a radio signal using a proprietary communication protocol.

Further, the primary device 22 may include additional communication circuitry, such as a second communication system 42, for communicating with a separate computing device, for example, a mobile computing device, such as a tablet or a smart phone, a personal computing device, a laptop computing device, a personal digital assistant, and the like. The communication circuitry may include modems, transmitter/receiver, and/or transceiver circuitry, for performing communications over one or more networks. To communicate wirelessly, the communication circuitry of either the first or second systems 34 or 42 may include one or more suitable antennas (not shown). For ease of illustration, FIG. 2A does not depict analog-to-digital converters, digital-to-analog converters, amplifiers, device controllers, etc., which will typically be included with the communication circuitry. However, because these and other components that may be included with the communication circuitry are known in the art, they will not be described in detail herein.

In some embodiments, the primary device 22 can be configured for communicating with a computing device, and to include a communication device that can be coupled via near field protocols, infrared protocols, BLUETOOTH protocols, IEEE 802 protocols, wired connections, such as a USB, Ethernet, or RS232 connection, etc.

In some embodiments, the I/O interface 28 allows the primary device 22 to be wirelessly bound or coupled to a secondary device 24 when the primary device 22 is placed in proximity with the secondary device 24, as will be described in greater detail below. In that regard, the secondary device 24 also includes a communication system 64, including a transmitter, a transceiver, and/or the like, configured to couple with the primary device 22 and to transmit signals thereto.

When the primary device 22 is in proximity with the secondary device 24, the first communication system 34 may perform discovery and binding processes so that the primary device 22 is capable of receiving one or more signals from the secondary device 24, thereby associating the primary device 22 with the secondary device 24. The discovery and binding processes can be automatic or user initiated via a switch, a graphical user interface element, or the like. In one non-limiting embodiment, the primary device 22 and the secondary device 24 are configured to be paired via a proprietary radio signal.

Once coupled, the primary device 22 may be configured, by way of I/O interface 28, to receive measurement data from the secondary device 24. The measurement data may be provided from the secondary device 24 to the primary device 22 via wireless communication or over another communication network. In particular, the secondary device 24 is configured to provide measurement data or other data generated by the secondary device 24 to the primary device 22.

Turning now to FIG. 3, in accordance with one embodiment of the present disclosure, an exemplary embodiment of a primary device 122 is provided. A display 130 is configured to display measurements from both the primary device 122 and a secondary device (not shown in FIG. 3). For example, referring to FIG. 3, the display 130 includes a first measurement value 150 and a first measurement type indication 152 (reading, respectively, "465.2" and "V AC"). In the illustrated embodiment, the measurement type indication 152 corresponds to the measurement type selected on the rotary switch 182. In addition, the display 130 includes a second measurement value 154 and second measurement type indication 156 that corresponds to a measurement from a secondary device (reading, respectively, "466.5" and "V AC"). The second measurement value 154 is identified by an identifier 158, shown as a "1" in bold print.

In the illustrated embodiment, the display 130 on the primary device 122 further includes a third measurement value 160 and a third measurement type indication 162 (reading, respectively, "74.3" and "° F."), and a fourth measurement value 164 and a fourth measurement type indication 166 (reading, respectively, "25.6" and "A AC"). The third and fourth measurement values 160 and 164 are identified by identifiers 168 and 170, shown respectively as a "2" and a "3" in bold print, and are received from additional secondary devices that are bound or coupled to the primary device 122. As discussed above, the display 130 on the primary device 122 may be configured to display measurement information from any number of different secondary devices.

The identifiers 158, 168, and 170 for the multiple secondary devices are custom-configurable for each of the secondary devices for simplified user identification. In that regard, the identifiers 158, 168, and 170 may include any number of characters or symbols.

As can be seen in the illustrated embodiment of FIG. 3, the display 130 may also be configured to display other information about the system 120 besides measurement information, for example, hazardous voltage being measured 172, risk of danger 174, data transmission status 176, and battery status 178 of the primary device 122. The display 130 may also be configured to include other information, such as the specific location (e.g., determined by GPS) of the primary device 122 or of any secondary devices, battery status of any secondary devices, name or identification information for any secondary devices, or any other information or measurement parameter from the secondary devices. Information shown on the display 130 may include, but is not limited to, primary device battery status, secondary device battery status, secondary device data logging status, secondary device data transmission status, primary device identification, secondary device identification, GPS location of the primary device, GPS location of the secondary device, primary device data, secondary device data, etc.

In the illustrated embodiment, the I/O interface 128 includes a keypad 180 for inputting information, a rotary switch 182, and a measurement system 132. In the illustrated embodiment, the keypad 180 includes various buttons for various different functions, including standard digital multimeter buttons, such as "HOLD," "MINMAX," "RANGE," and "SHIFT," and non-standard wireless function buttons 184, 186, and 188. For example, radio button 184 can be pressed to set the primary device 22 to turn on the communication circuitry 34 and start the module discovery process to look for secondary devices 24, as described in greater detail below. After a secondary device 24 has been "discovered," the user can use the "SELECT" button 186 to bind (or unbind) the secondary device 24 with the primary device 22. Scroll button 188 can be used to scroll between various "discovered" secondary devices 24.

As discussed above, the rotary switch 182 includes exemplary selections for measuring DC voltage, AC voltage, resistance, continuity, and current, as indicated by the plurality of rotary switch positions in FIG. 3. However, it should be appreciated that the rotary switch 182 may be used to select any type of measurement parameters. In addition, the rotary switch 182 also includes an "OFF" position to stop taking measurements and turn the device off.

The measurement interface 132 for connecting measurement equipment includes various terminals to connect equipment to take measurements. In the illustrated embodiment, the terminals include a first terminal 190, which may be an input for current measurements and current frequency, a second terminal 192, which may be a return terminal for all instruments, and a third terminal 194, which may be an input for voltage, resistance, diode, capacitance, and voltage frequency measurements.

Returning to FIGS. 1 and 2, the secondary device 24 will now be described in greater detail. The secondary device 24 may be substantially similar to the primary device 22, or may be different from the primary device 22. In that regard, the secondary device 24 may be the same digital multimeter shown in FIG. 3, or the secondary device may be another test instrument, for example, a temperature module (see FIG. 4), a clamp meter (see FIGS. 5 and 6), or a flexible current probe meter (see FIG. 7).

The measurement made by the secondary device 24 may be an electrical, mechanical, physical, or another parameter, including, but not limited to, voltage, current, vibration, resistance, capacitance, inductance, frequency, temperature, relative humidity, magnetic field, flow velocity, moisture, rotations per minute, pressure, distance, light, contact infrared, decibels, and a calculated value derived from a primary measurement, such as wattage, power quality, crest factor, and duty cycle.

Returning to the illustrated embodiment of FIG. 2A, the secondary device 24 includes various components including an input/output (I/O) interface 58 (including, for example, an optional display 60 and an input interface 66 for user input), a measurement system 62 for taking measurements, a communication system 64 for receiving and/or transmitting information, a central processing unit (CPU) or processor 68, and a storage system 70 for storing information. The secondary device 24 does not require a display 60, but may include one. The components are substantially similar to components described above with reference to the primary device 22, and therefore, will not be described again, except where there are differences.

The secondary device 24 may be controlled by the primary device 22 or may be independently controlled. In that regard, the user may activate the secondary device 24 for testing, or the user may use the primary device 22 to activate the secondary device 24. Moreover, the secondary device 24 may be set up for specific test parameters using the controls of the secondary device 24 or using the controls of the primary device 22.

The secondary device 24 includes a communication button 284 (see FIGS. 4-7) to turn the communication system 64 on and start the module discovery process so that the primary device 22 can "discover" or identify the availability of communication with the secondary device 24. Depressing the same button 284 turns the communication system 64 off. The term "discovery" refers to a procedure in which the primary device 22 looks for compatible radio signals from secondary devices 24. After discovery, the secondary device 24 and the primary device 22 can be "bound" to each other, meaning that a wireless connection has been made. Although illustrated and described as including a communication button 284, it should be appreciated that the secondary device 24 may also be configured to automatically communicate when powered on, without requiring the activation of a communication button.

To start the discovery procedure in accordance with one embodiment of the present disclosure, the user may activate the communication buttons 184 and 284 on each of the respective primary and secondary devices 22 and 24. See, for example, blocks 80 and 84 in the flowchart diagram of FIG. 2B. In the illustrated embodiment of FIG. 3, the transmission status identifier 176 may be displayed on the primary device during the discovery process. When activated, the primary device 22 listens for signals (see, for example, block 86 in the flowchart diagram of FIG. 2B) sent from secondary devices 24 that send signals periodically, for example, once every five seconds. The signal sent by the secondary devices 24 may be a data signal, a present signal, or another signal (see, for example, block 82 in the flowchart diagram of FIG. 2B).

When a secondary device 24 is discovered by the primary device 22 (see, for example, block 88 in the flowchart diagram of FIG. 2B), an indicator may appear on the primary device 22. For example, a module number of the secondary device 24 may appear in the display 30 of the primary device 22. After discovery, the primary device 22 may be configured to bind with the secondary device 24. In one embodiment of the present disclosure, the secondary device 24 may automatically bind with the primary device 24. In another embodiment, the user may press a "SELECT" button 186 to bind the secondary device 24 with the primary device 22. Likewise, the user may press the "SELECT" button 186 again to deselect the secondary device 24 (see, for example, block 90 in the flowchart diagram of FIG. 2B) and thereby unbind or release the secondary device 24 from communication with the primary device 22. If multiple secondary devices 24 have been discovered, the user may use a scroll button 188 to scroll between the different secondary devices 24.

In an embodiment of the present disclosure, the binding process may wake up the secondary device 24 (for example, if it is in a sleep mode) and establish communication such that information from the secondary device 24 is periodically transmitted to the primary device 22. In that regard, the primary device 22 may request information, such as measurement data from the secondary device 24, and the secondary device 24 may transmit the information to the primary device 22 (see, for example, blocks 92 and 94 in the flowchart diagram of FIG. 2B). For example, if the secondary device 24 is configured to take a measurement once every 20 seconds, then such measurement data can be transmitted to the primary device 22 as it is generated. Such information may also be shown in the display on the primary device 22, for example, the identification 158 of the secondary device 24, the data received 154, and the data type 156.

To unbind the primary device 22 and the one or more bound secondary devices 24, the radio of either the primary device 22 or the secondary devices 24 may be turned off. Alternatively, the primary device 22 may be configured to simply unbind the secondary device 24, or the primary device 22 may simply go out of communication range with the secondary device 24. If the primary device 22 unbinds a secondary device 24, but the secondary device 24 radio is left on for communicating and measuring data, the secondary device 24 may continue to take measurements and store the data in its storage system 240. When re-bound, the secondary device 24 may be configured to transfer all of the stored data to the primary device 22 to which it is bound.

In an embodiment of the present disclosure, the system 20 includes a single-ended binding procedure, such that the secondary device 24 is configured to communicate with the primary device 22, wherein the primary device 22 and the secondary device 24 are automatically bound by activating only the primary device. In that regard, a secondary device 24 may be set up in place with its discovery feature already activated, such that the secondary device 24 transmits a signal periodically, for example, once every five seconds. A user, hours or days later, can enter the area with a primary device 22 and can activate the discovery button 284 on the primary device. If the primary device 22 discovers the secondary device 24, the primary device can unilaterally select the secondary device 24 for binding and thereby establish a communication link with the secondary device 24. No pre-pairing is required between specific primary and secondary devices 22 and 24. The user may only have physical access to the primary device 22 and not to the secondary device 24. After binding, the user can then take measurements using the primary device 22 and also receive data from the secondary device 22.

It should also be appreciated that secondary devices 24 of the system 20 described herein may be configured for open binding, wherein multiple primary devices 22 can bind with the same secondary devices 24. Therefore, a first technician can use his primary device 22 to take and read measurements from one or more secondary devices 24, and a second technician having his own primary device 22 can also take and read measurements from the secondary devices 24, for example, after the first device 22 has become unbound from the secondary devices 24. This configuration is particularly helpful when primary devices 22 are lost or damaged and must be replaced or when different technicians having different primary device equipment are visiting the location of the system 20. In addition, because the system 20 is modular, secondary devices 24 for additional measurements can always be added or replaced in the original system 20 if needed.

In an embodiment of the present disclosure, the system 20 may be configured such that a secondary device 24 is capable of binding with only one primary device 22 at a time. When released from binding, the secondary device 24 may bind with another primary device 22. With this configuration, the potential for user confusion or misreading secondary devices is greatly reduced.

In another embodiment of the present disclosure, the system 20 may generate a signal when the primary and secondary devices 22 and 24 are communicating with one another via a communication link. For example, the secondary device 24 may generate a visual, vibrating, or auditory signal when it is communicating with the primary device 22. Moreover, the primary device 22 may also generate a signal to indicate the secondary device 24 with which it is communicating. For example, referring to FIG. 3, when the primary device 22 is communicating with secondary device 24 identified as "1," the identification indicator 158 in the display 130 may be highlighted or may start to blink.

Referring to FIG. 1, and as mentioned above, the system 20 may be set up in a one-to-many communication network, such that the primary device 22 communicates directly with each of the secondary devices 24. As compared to a mesh communication network, wherein each discrete device communicates with multiple other devices in the network, the communication network of the system 20 is more limited in its scope of coverage, but requires significantly less power than a mesh communication network. In one embodiment of the present disclosure, the radius of communication between primary and secondary devices 22 and 24 is less than about 100 meters. In another embodiment of the present disclosure, the radius of communication between primary and secondary devices 22 and 24 is less than about 20 meters.

In view of the reduced power requirements of the communication network, the primary and secondary devices 22 and 24 may operate on battery power that lasts at least 100 hours. However, it should be appreciated that battery life is dependent on the type of batteries used, the types of measurements being made with the system, the number of batteries in the system, and the operational configuration of the devices in the system. The life expectancy for each device in the system may vary, for example, a primary device may have a different life expectancy than a secondary device. Other power management features of the system include sleep (non-communicating) modes for devices and periodic communication (for example, in the secondary devices, every five seconds).

The operation of the system 20 will now be described. A user sets up the system 20 by selecting one or more appropriate types of secondary devices 24, placing them in an appropriate location with respect to the machinery to be tested, and setting them up to take measurements. The secondary devices 24 are turned on, set for measurements, and set in communication mode, for example, by pressing discovery button 284 (see FIGS. 4-7). As discussed above, when activated for communication, the secondary devices 24 transmit a periodic signal that can be received (or discovered) by a primary device 22.

The user then turns on the primary device 22 and sets it to measure a certain parameter. The user also activates the discovery mode of the primary device 22, for example, by pressing its communication button 184 (see FIG. 3). When the primary device 22 locates one or more secondary devices 24, the user binds one or more of the secondary devices 24 to the primary device 22 and begins to receive periodic data from the one or more secondary devices 24. Such data can be viewed in the display 30 of the primary device 22.

Referring now to FIGS. 8-11, another embodiment of the present disclosure will be described with regard to a system that includes a gateway device. It should be appreciated that components of the gateway system embodiment of FIGS. 8-11 are substantially similar in materials and operation to many components of the previously described embodiments of FIGS. 1-7, except for differences regarding communication and measurement features, as will be described in more detail below. For clarity in the ensuing description, reference numerals of like elements of the system 20 described in the embodiments of FIGS. 1-7 are used to describe the system 320 of FIGS. 8-11, except using numbers in a 300 series of numbers.

Figure 8:
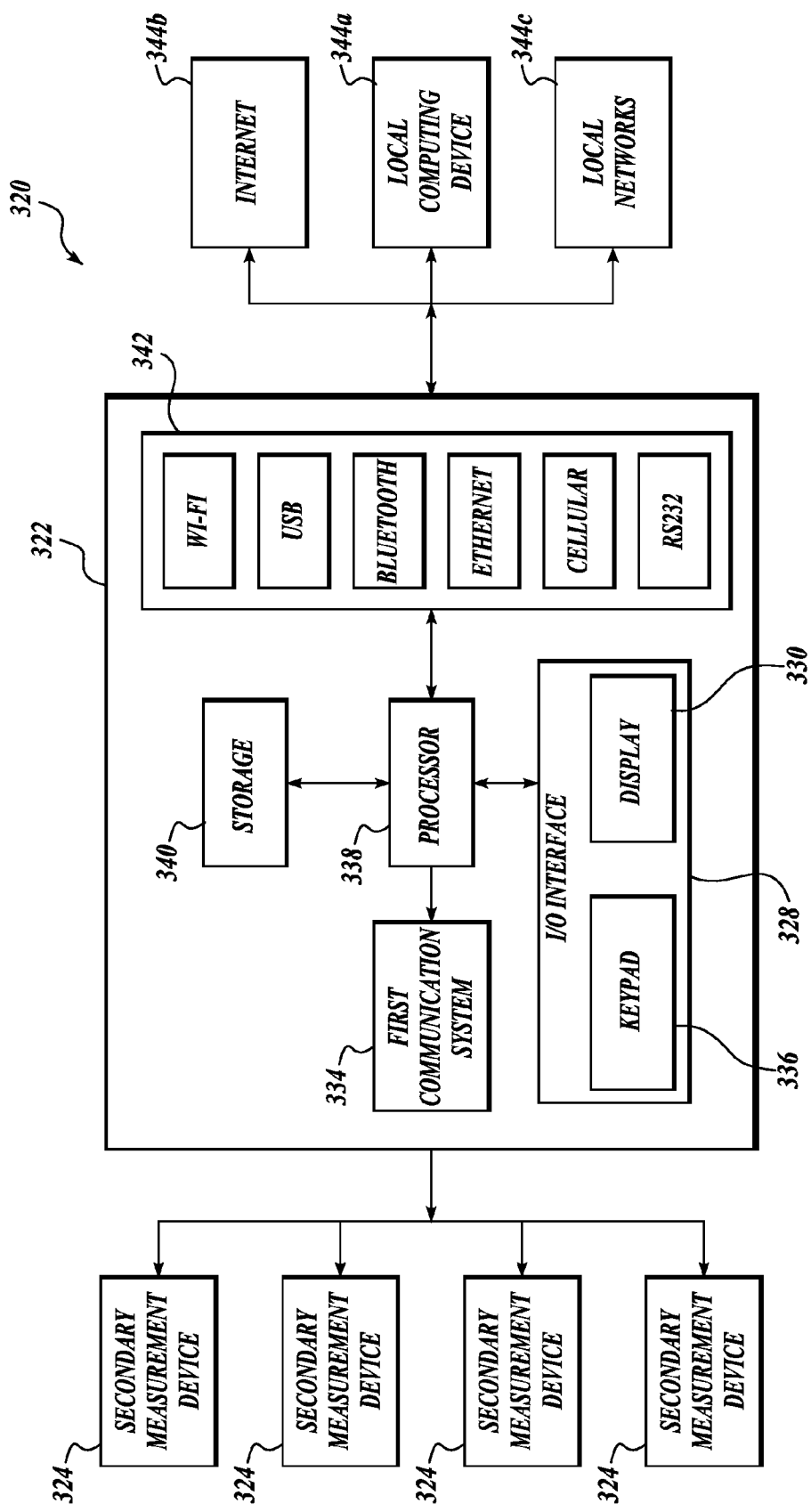
FIG. 8 is a schematic of operation for a gateway system in accordance with another embodiment of the present disclosure.
Figure 9:
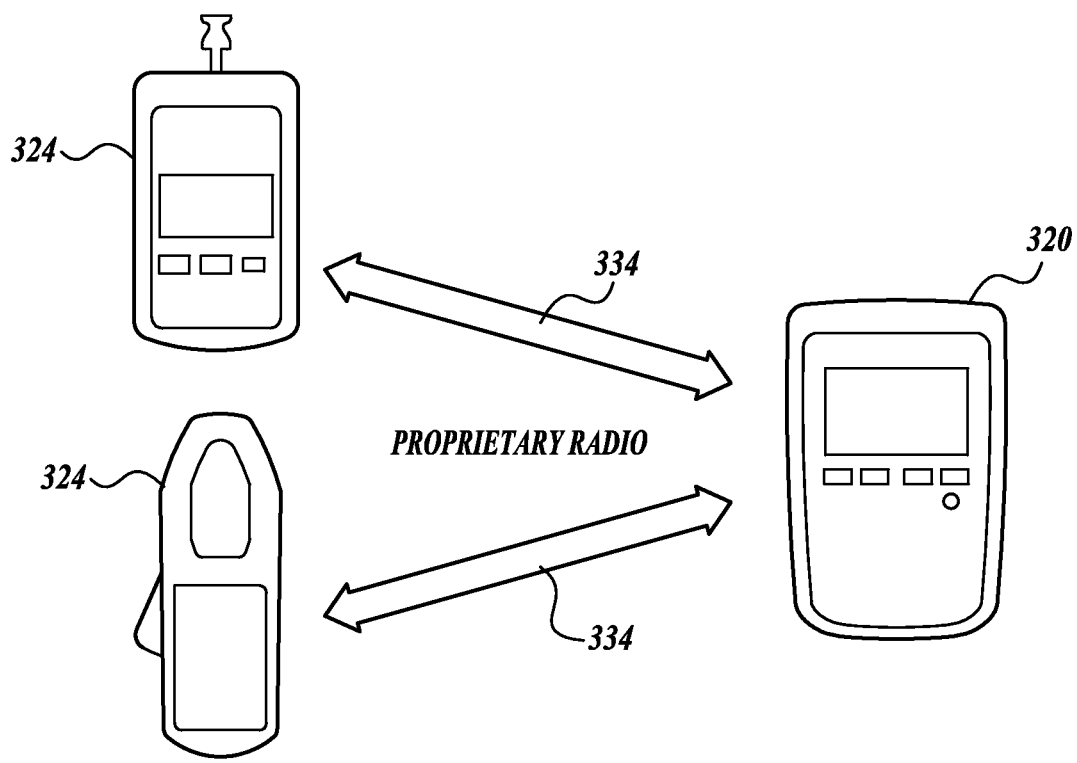
Figure 10:
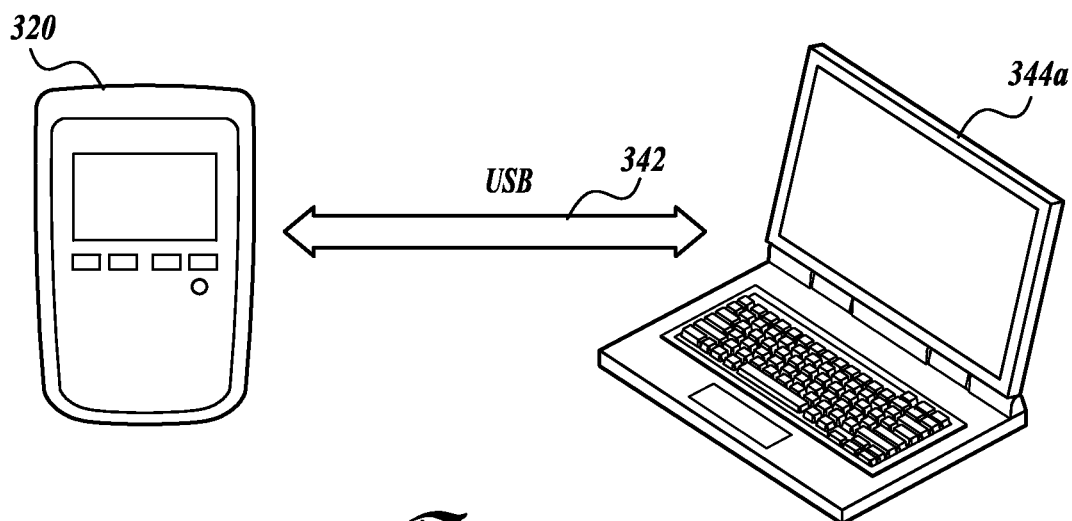

Referring to FIG. 8, in accordance with one embodiment of the present disclosure, a schematic for a system 320 including a gateway device 322 is provided. As mentioned above, the gateway system 320 may be substantially similar to the system 20 described above. Likewise, the gateway 322 may be substantially similar in materials and operation to the primary device 22 described above, except that the gateway 322 may not be a measuring device configured to make measurements.

The components of the gateway device 322 may include various components including an input/output (I/O) interface 328 (including, for example, an optional display 330 and an input interface 336 for user input), a first communication system 334 for receiving and/or transmitting information from a secondary device 324, a central processing unit (CPU) or processor 338, a storage system 340 for storing information, and a second communication system 342 for receiving and/or transmitting information to a local computing device 344a, or to remote computing devices via the Internet 344b or local networks 344c. Unlike the primary device 22, the gateway device 322 may not take a measurement.

The first communication system 334 may be a suitable wired or wireless communication protocol for transmitting and/or receiving information. In one embodiment of the present disclosure, the information is communicated in the system 320, for example, from the secondary device 324 to the gateway device 322, by a radio signal using a proprietary protocol (see, e.g., FIG. 9). Therefore, the gateway device 322 is configured to receive at least one communication signal, for example, at least one radio signal, containing at least one measurement value directly from at least one measurement device 324.

The gateway device 322 includes a signal translator that translates the radio signal containing data to a translated signal containing the data using a different protocol. For example, the gateway device 322 receives the data in a radio signal that uses a first proprietary protocol, then translates the signal into a signal using a second protocol that can be transmitted to a computing device 344a, to the Internet 344b, or to local networks 344c. In accordance with embodiments of the present disclosure, the various second communication systems 342 for receiving and/or transmitting information to a computing device 344a, to the Internet 344b, or to local networks 344c may include, but is not limited to, USB (see e.g., FIG. 10), Wi-Fi (see e.g., FIG. 11), BLUETOOTH, Ethernet, Cellular, and RS232 communication.

The gateway device 322 further includes a data memory system for collecting the data. The data may include a plurality of measurement values from at least one secondary device 324 or a plurality of measurement values from a plurality of secondary devices 324. Therefore, the first communication system 334 is configured to receive a plurality of periodic radio signals. For example, the system 320 may include multiple secondary devices 324, as shown in the illustrated embodiment of FIG. 8. In accordance with embodiments of the present disclosure, the gateway device 322 may be configured to receive more than two, more than seven, or more than ten radio signals, which may be received either simultaneously or close in time to one another, from multiple secondary devices 324. In comparison, a BLUETOOTH system, for example, is configured to communicate with only seven discrete components.

Like the primary device 22 described above, the gateway device 322 may also be configured to have a single-binding system. In that regard, a secondary device 324 may be configured to communicate with the gateway device 322 by activating binding between the gateway device 322 and the secondary device 24 using only the gateway device 322. To unbind, the gateway device 322 may be activated to release the secondary device 324, or the gateway device 322 or any bound secondary devices 324 may simply be powered down.

The gateway device 322 may include a display or may be without a display. The feature of not including a display is believed to reduce instrument complexity and to reduce the threat of theft of the device 322. In one embodiment of the present disclosure, the gateway device 322 is a handheld device. In another embodiment of the present disclosure, the gateway device 322 may be placed or affixed to a certain location, for example, at or near the control panel of the machine for ease of use.

The gateway device 322 may further include a data manipulation system with capabilities for manipulating data collected in the data memory system. For example, the data manipulation system may be configured to calculate values, compare values, indicate trends, or prepare graphs or other visual presentations of the data.

While various illustrative embodiments have been shown and described above, it will be appreciated that changes can be made therein without departing from the spirit and scope of the disclosure.

The embodiments of the invention in which an exclusive property or privilege is claimed are defined as follows:

1. A gateway device for a measurement system, the gateway device comprising:
   a first communication system configured to receive a plurality of signals containing data according to a first protocol, wherein the plurality of signals are received from a plurality of handheld measurement devices that measure electrical, mechanical, or physical parameters of a machine, and wherein the data includes a plurality of measurement values from the plurality of handheld measurement devices;
   a data translator configured to translate the plurality of signals containing the data to one or more translated signals containing the data according to a second protocol different from the first protocol;
   a data memory system configured to collect the data; and
   a second communication system configured to communicate the data collected in the data memory device to a separate computing device by transmitting the translated signals to the separate computing device,
   wherein the first communication system is configured to communicate with at least one handheld measurement device of the plurality of handheld measurement devices using a single-ended binding procedure in which the gateway device receives a signal that is periodically transmitted by the at least one handheld measurement device and, by activating only the gateway device, the gateway device unilaterally selects the at least one handheld measurement device for binding and automatically binds the at least one handheld measurement device with the gateway device for communication via a communication link between the gateway device and the at least one handheld measurement device.

2. The gateway device of claim 1, wherein the data includes a plurality of measurement values from at least one handheld measurement device of the plurality of handheld measurement devices.

3. The gateway device of claim 1, wherein the plurality of signals are selected from the group consisting of more than two signals, more than seven signals, and more than ten signals.

4. The gateway device of claim 1, wherein the second protocol is selected from the group consisting of a near field protocol, an infrared protocol, a BLUETOOTH protocol, an IEEE 802 protocol, and a wired connection protocol.

5. The gateway device of claim 1, further comprising a display for displaying the data collected in the data memory system.

6. The gateway device of claim 1, wherein the gateway device does not include a display.

7. The gateway device of claim 1, further comprising a data manipulation system configured to manipulate the data collected in the data memory system.

8. The gateway device of claim 1, wherein the gateway device is not a measurement device.

9. A method of collecting measurement data from a handheld measurement device, the method comprising:
   in a first communication system of a gateway device, receiving a plurality of signals containing data according to a first protocol, wherein the plurality of signals are received from a plurality of handheld measurement devices that measure electrical, mechanical, or physical parameters of a machine, and wherein the data includes a plurality of measurement values from the plurality of handheld measurement devices;
   translating the plurality of signals containing the data to one or more translated signals containing the data according to a second protocol different from the first protocol; and
   storing the data in a data memory system on the gateway device,
   the method further comprising establishing a communication link between the first communication system and at least one handheld device of the plurality of handheld measurement devices by using a single-ended binding procedure in which the gateway device receives a signal that is periodically transmitted by the at least one handheld measurement device and, by activating only the gateway device, the gateway device unilaterally selects the at least one handheld measurement device for binding and automatically binds the at least one handheld measurement device with the gateway device for communication via the communication link; and
   transmitting the translated signals to a separate computing device using a second communication system of the gateway device.

10. The gateway device of claim 1, wherein the gateway device further comprises a measurement system configured to measure an electrical, mechanical, or physical parameter of a machine.

11. The gateway device of claim 10, wherein the data in the translated signals include a measurement value measured by the measurement system of the gateway device.

12. The method of claim 9, further comprising using a measurement system in the gateway device to measure an electrical, mechanical, or physical parameter of a machine.

13. The method of claim 12, further comprising including a measurement value measured by the measurement system of the gateway device with the data in the translated signals.

\* \* \* \* \*